United States Patent
Lee et al.

(10) Patent No.: US 11,061,052 B2
(45) Date of Patent: Jul. 13, 2021

(54) PROBE INCLUDING AN ALIGNMENT KEY PROTRUDED FROM A SIDE OF AN ALIGNMENT BEAM AND A PROBE CARD INCLUDING THE SAME

(71) Applicant: SAMSUNG ELECTRONICS CO., LTD., Suwon-si (KR)

(72) Inventors: Sung-Hoon Lee, Hwaseong-si (KR); Byoung-Joo Kim, Hwaseong-si (KR); Mi-Rye Lee, Hwaseong-si (KR); Hwang-Jin Yeo, Hwaseong-si (KR); Tae-Jong Lee, Seoul (KR)

(73) Assignees: SAMSUNG ELECTRONICS CO., LTD., Suwon-si (KR); MICROFRIEND CO., LTD., Seoul (KR)

( * ) Notice: Subject to any disclaimer, the term of this patent is extended or adjusted under 35 U.S.C. 154(b) by 124 days.

(21) Appl. No.: 16/368,493

(22) Filed: Mar. 28, 2019

(65) Prior Publication Data

US 2020/0081035 A1     Mar. 12, 2020

(30) Foreign Application Priority Data

Sep. 11, 2018 (KR) .......................... 10-2018-0108211

(51) Int. Cl.
*G01R 1/067* (2006.01)
*G01R 31/26* (2020.01)
*G01R 1/073* (2006.01)

(52) U.S. Cl.
CPC ..... *G01R 1/06794* (2013.01); *G01R 1/07342* (2013.01); *G01R 1/07378* (2013.01); *G01R 31/2601* (2013.01)

(58) Field of Classification Search
CPC ............ G01R 1/06794; G01R 31/2891; G01R 31/2863; G01R 1/07378; G01R 31/2601; G01R 1/07342; G01R 1/07314; H01R 13/2435; H01R 13/2442; H01R 13/2407; H01R 12/52
See application file for complete search history.

(56) References Cited

U.S. PATENT DOCUMENTS

| | | | | |
|---|---|---|---|---|
| 6,483,328 | B1 * | 11/2002 | Eldridge | ........... H01L 23/49811 324/754.18 |
| 7,586,321 | B2 | 9/2009 | Hirakawa et al. | |
| 7,782,072 | B2 * | 8/2010 | Fan | .................... G01R 1/06727 324/754.03 |
| 7,898,272 | B2 * | 3/2011 | Sasaki | ................ G01R 31/2889 324/756.03 |
| 7,977,956 | B2 * | 7/2011 | Breinlinger | ........ G01R 31/2891 324/750.16 |

(Continued)

FOREIGN PATENT DOCUMENTS

| | | |
|---|---|---|
| JP | 5412685 | 11/2013 |
| JP | 2015-190942 | 11/2015 |
| JP | 2015-203689 | 11/2015 |

(Continued)

*Primary Examiner* — Vinh P Nguyen
(74) *Attorney, Agent, or Firm* — F. Chau & Associates, LLC

(57) ABSTRACT

A probe includes a probe body for providing an object with a test signal; a tip arranged on an end of the probe body to make contact with the object; and an alignment key protruded from a side of the probe body.

16 Claims, 9 Drawing Sheets

(56) References Cited

U.S. PATENT DOCUMENTS

| | | | |
|---|---|---|---|
| 8,404,496 B2 | 3/2013 | Maruyama et al. | |
| 2012/0242359 A1 | 9/2012 | Obi et al. | |

FOREIGN PATENT DOCUMENTS

| | | |
|---|---|---|
| KR | 10-2009-0030429 | 3/2009 |
| KR | 10-0972995 | 7/2010 |
| KR | 10-1335146 | 12/2013 |

* cited by examiner

FIG. 7
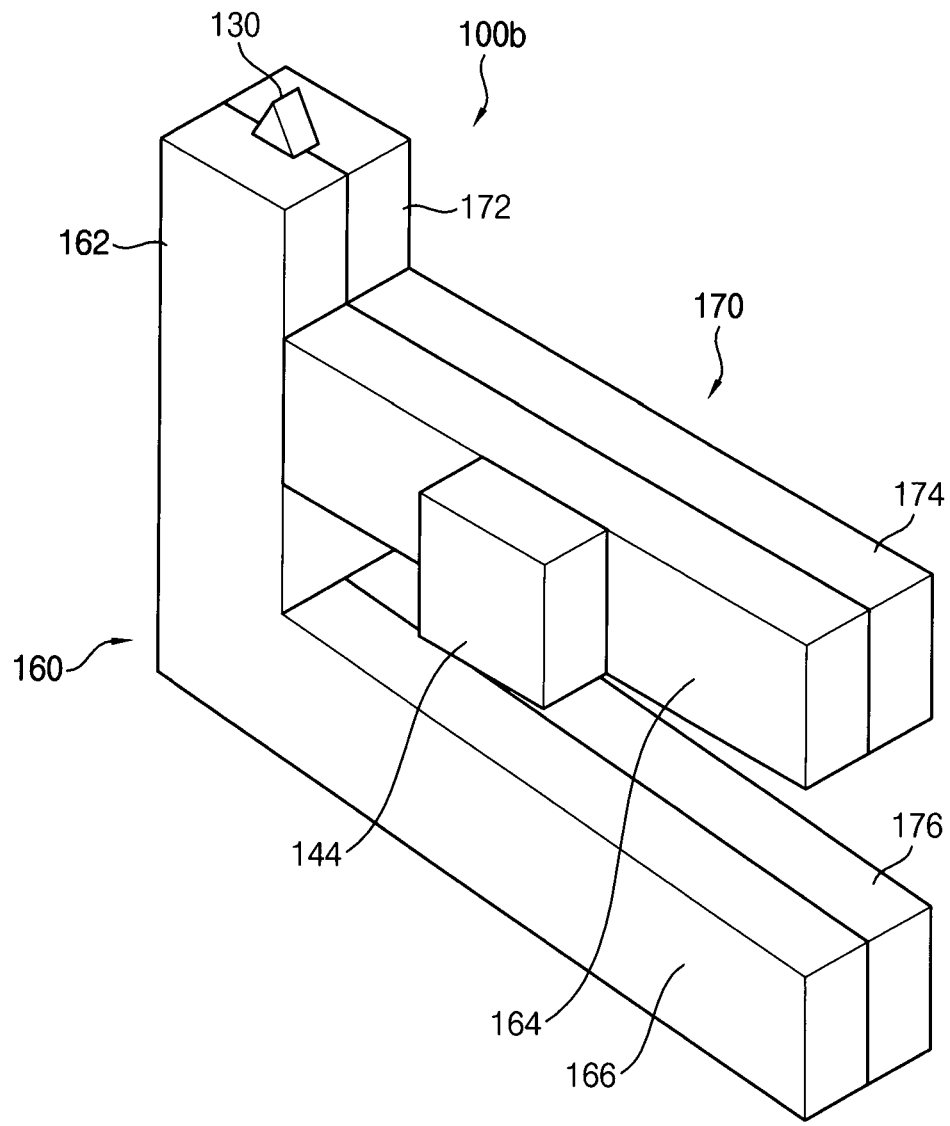
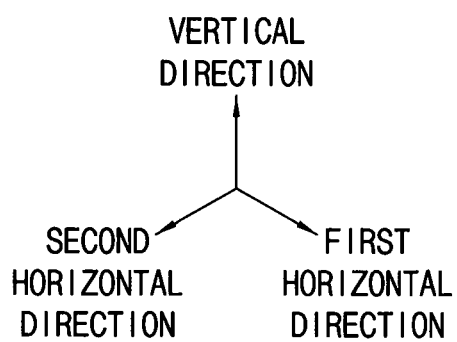

PROBE INCLUDING AN ALIGNMENT KEY PROTRUDED FROM A SIDE OF AN ALIGNMENT BEAM AND A PROBE CARD INCLUDING THE SAME

CROSS-REFERENCE TO RELATED APPLICATION

This application claims priority under 35 U.S.C. § 119 to Korean Patent Application No. 10-2018-0108211, filed on Sep. 11, 2018 in the Korean Intellectual Property Office (KIPO), the disclosure of which is incorporated by reference herein in its entirety.

1. Technical Field

The present inventive concept relates to a probe and a probe card including the same.

2. Discussion of the Related Art

In order to test electrical characteristics of a semiconductor chip, a test signal may be applied to the semiconductor chip. The test signal may be generated from a tester. In order to electrically connect the tester with the semiconductor chip, a probe card may be used.

The probe card may include a printed circuit board (PCB) and a plurality of probes. The PCB may be electrically connected with the tester. The probes may be arranged on the PCB, and may make contact with pads of the semiconductor chip. An alignment key for aligning the probes with the semiconductor chip may be arranged on any one of the probes. The alignment key may be arranged on an upper surface of the probe. A camera for photographing the alignment key may mistakenly recognize a similar pattern adjacent to the alignment key as the alignment key. Further, when the probe having the alignment key is used only for aligning the probe, the alignment key may not reflect height changes of the probe in contact with the pads of the semiconductor chip. Thus, the probes may be misaligned with respect to the semiconductor chip. As a result, test reliability of the semiconductor chip may be decreased.

SUMMARY

According to exemplary embodiments of the inventive concept, there may be provided a probe. The probe may include a probe body, a tip and an alignment key. The probe body may provide an object with a test signal. The tip may be arranged on an end of the probe body to make contact with the object. The alignment key may protrude from a side surface of the probe body.

According to exemplary embodiments of the inventive concept, there may be provided a probe card. The probe card may include a printed circuit board (PCB), a plurality of probes and an alignment key. The PBC may include a test pattern through which a test signal for testing a semiconductor chip may flow. Each of the probes may include a probe body, a tip and an alignment key. The probe body may be electrically connected with the test pattern. The tip may be arranged on an end of the probe body to contact with a terminal of the semiconductor chip. The alignment key may protrude from a side surface of the probe body of at least one among the probes.

BRIEF DESCRIPTION OF THE DRAWINGS

The above and other features of the inventive concept will be more clearly understood by describing in detail exemplary embodiments thereof with reference to the accompanying drawings, in which:

FIG. 7 is a perspective view illustrating a probe in accordance with an exemplary embodiment of the inventive concept;

DETAILED DESCRIPTION OF THE EMBODIMENTS

Hereinafter, exemplary embodiments of the inventive concept will be explained in detail with reference to the accompanying drawings.

Figure 1:
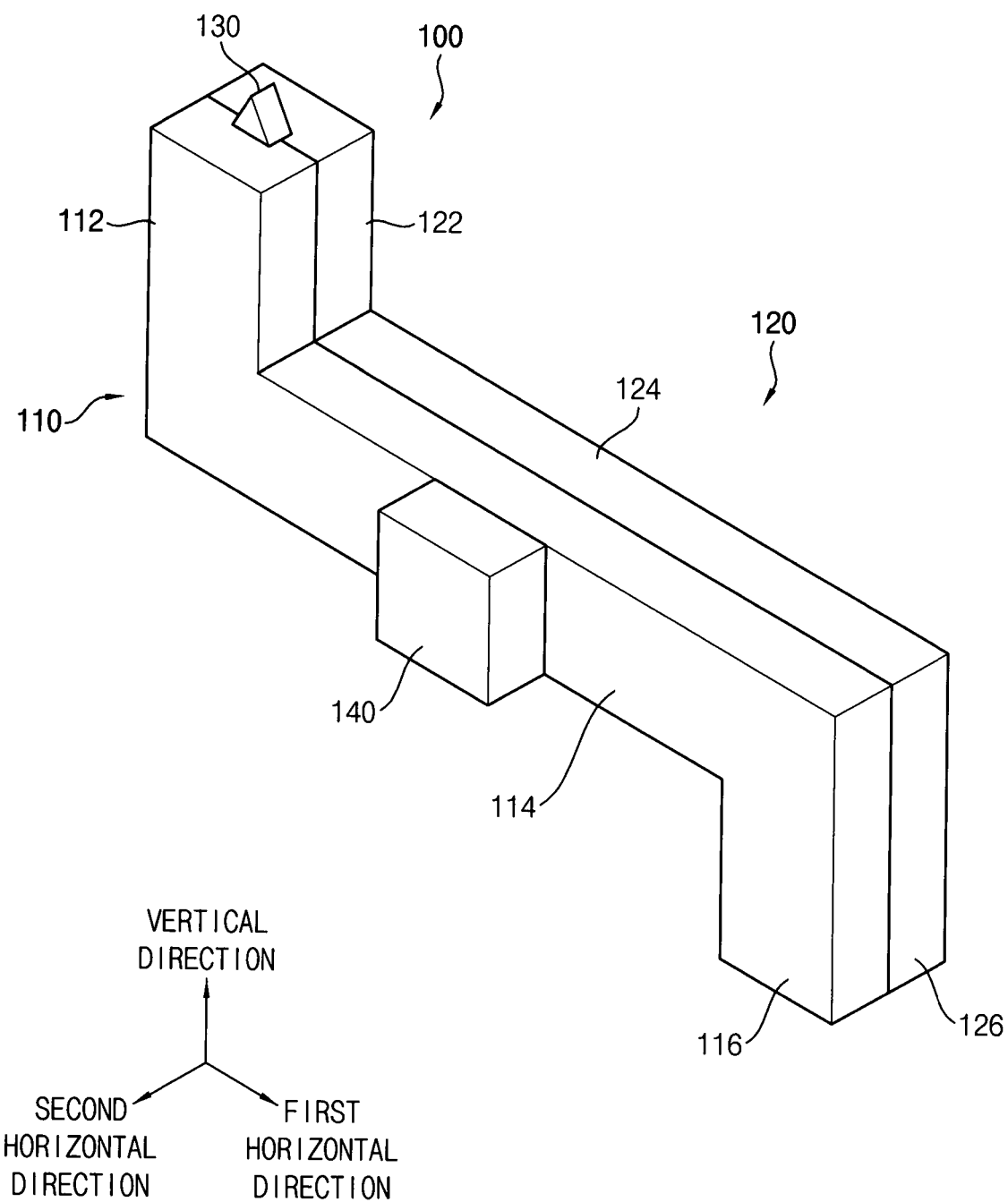
FIG. 1 is a perspective view illustrating a probe in accordance with an exemplary embodiment of the inventive concept.
Figure 2:
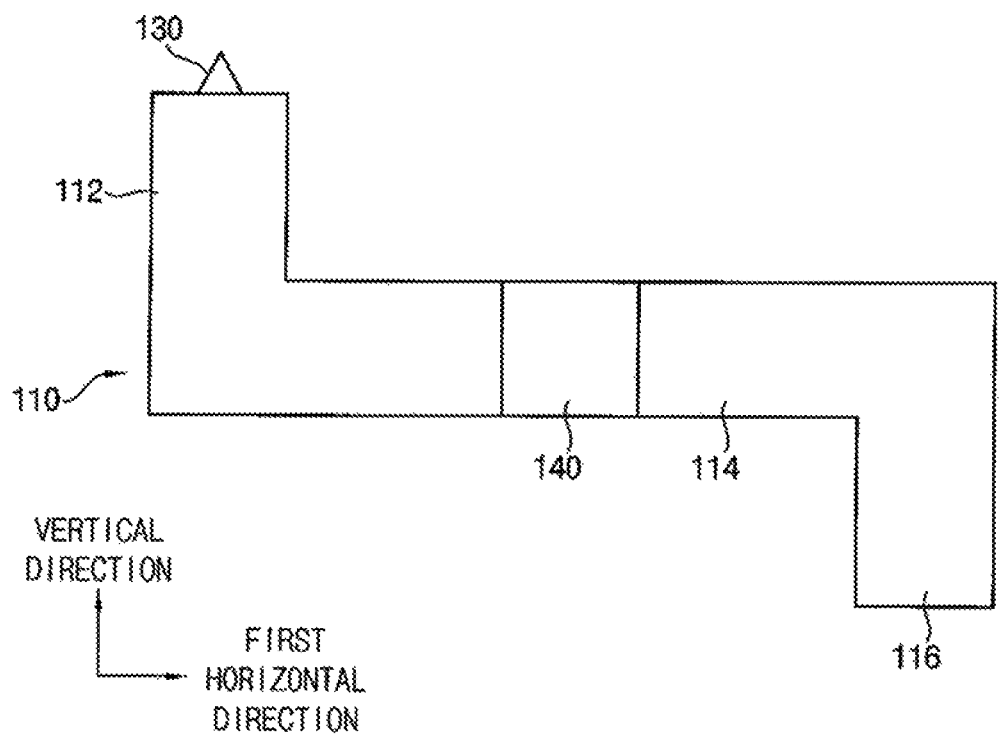
FIG. 2 is a side view illustrating the probe in FIG. 1.
Figure 3:
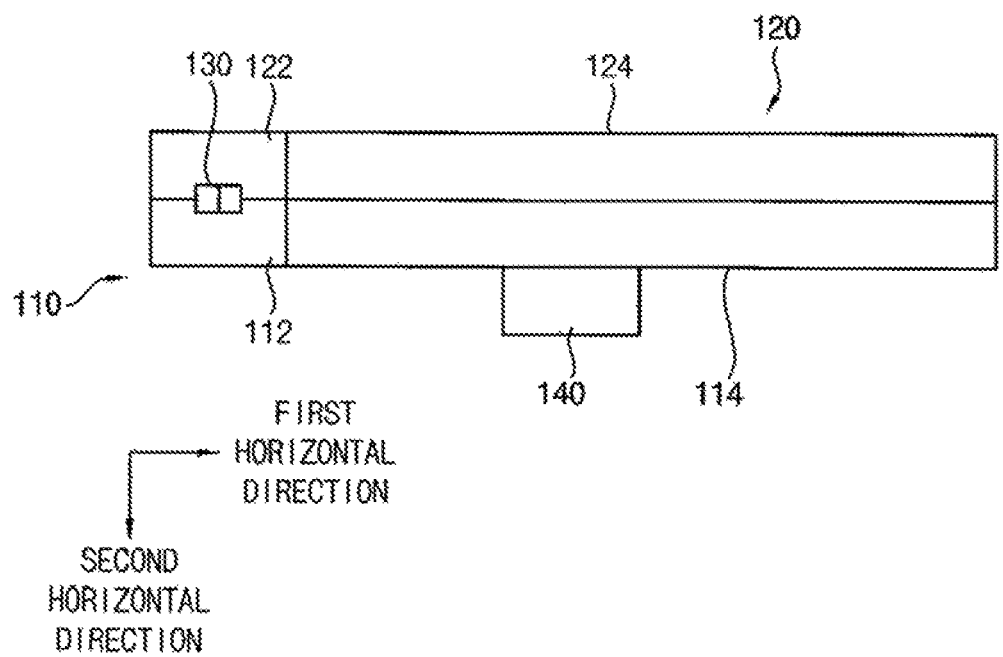
FIG. 3 is a plan view illustrating the probe in FIG. 1.

FIG. 1 is a perspective view illustrating a probe in accordance with an exemplary embodiment of the inventive concept, FIG. 2 is a side view illustrating the probe in FIG. 1, and FIG. 3 is a plan view illustrating the probe in FIG. 1.

Referring to FIGS. 1 to 3, a probe 100 may be arranged at a printed circuit board (PCB) of a probe card. The probe 100 may have a two dimensional structure. The probe 100 may include a first probe body 110, a second probe body 120, a tip 130 and an alignment key 140.

The first probe body 110 may include a first upper vertical beam 112, a first horizontal beam 114 and a first lower vertical beam 116. The first upper vertical beam 112 may extend in a vertical direction. The first horizontal beam 114 may extend from a lower end of the first upper vertical beam 112 in a first horizontal direction. The first lower vertical beam 116 may extend from an end of the first horizontal beam 114 in the vertical direction. For example, the first upper vertical beam 112 and the first lower vertical beam 116 may be disposed at opposite ends of the length of the first horizontal beam 114, and may extend in parallel but opposite directions from one another along a vertical direction. The first upper vertical beam 112, the first horizontal beam 114 and the first lower vertical beam 116 may collectively form a rectangular parallelepiped shape having substantially the same width throughout. Further, the first upper vertical beam 112, the first horizontal beam 114 and the first lower vertical beam 116 may be integrally formed with each other, but the inventive concept is not limited thereto.

The second probe body 120 may contact an inner surface of the first probe body 110. The second probe body 120 may have a shape substantially the same as that of the first probe body 110. Thus, the second probe body 120 may include a second upper vertical beam 122, a second horizontal beam 124 and a second lower vertical beam 126. The second upper vertical beam 122 may extend in the vertical direction. The second horizontal beam 124 may extend from a lower end of the second upper vertical beam 122 in the first horizontal direction. The second lower vertical beam 126 may extend from an end of the second horizontal beam 124 in the vertical direction. The second upper vertical beam 122, the second horizontal beam 124 and the second lower vertical beam 126 may have a rectangular parallelepiped shape having substantially the same width throughout. Further, the second upper vertical beam 122, the second horizontal beam 124 and the second lower vertical beam 126 may be integrally formed with each other.

An inner surface of the first upper vertical beam 112 may contact an inner surface of the second upper vertical beam 122. In other words, the first upper vertical beam 112 and the second upper vertical beam 122 may overlap one another. An inner surface of the first horizontal beam 114 may contact an inner surface of the second horizontal beam 124. In other words, the first horizontal beam 114 may overlap the second horizontal beam 124. An inner surface of the first lower vertical beam 116 may make contact with an inner surface of the second vertical beam 126. In other words, the first lower vertical beam 114 may overlap the second vertical beam 126. The first lower vertical beam 116 and the second lower vertical beam 126 may be connected to the PCB.

The tip 130 may be disposed at an area of overlap between upper surfaces of the first and second probe bodies 110 and 120. Particularly, the tip 130 may be disposed in a space between the upper surface of the first upper vertical beam 112 in the first probe body 110 and the upper surface of the second upper vertical beam 122 in the second probe body 120. The tip 130 may contact a pad of a semiconductor chip.

The alignment key 140 may be provided in a plurality of areas of the probe 100. For example, the alignment key 140 may be disposed on at least one of the probes 100. In exemplary embodiment of the inventive concept, the alignment key 140 may be arranged on a side surface of the first probe body 110. In other words, the alignment key 140 may protrude from an outer side surface of the first probe body 110 in a second horizontal direction substantially perpendicular to the first horizontal direction. Particularly, the alignment key 140 may protrude from an outer side surface of the first horizontal beam 114 of the first probe body 110 in the second horizontal direction. Thus, the alignment key 140 may be positioned at a side of the first probe body 110, but might not be disposed on the upper surfaces of the first and second probe bodies 110 and 120. For example, the alignment key 140 may protrude from a side surface of the first horizontal beam 114 or the second horizontal beam 124 from a top view perspective. Therefore, a camera may accurately recognize the alignment key 140, and not mistake a similar pattern for the alignment key 140.

Further, in order to accurately recognize the alignment key 140 by the camera, the alignment key 140 may include a fin, annular, and/or angular shape, and may have coloration, when viewed from the camera, that contrasts with the remainder of the probe 100. In exemplary embodiments of the inventive concept, the alignment key 140 may have a rectangular parallelepiped shape. The thickness of the alignment key 140 may refer to the portion of the alignment key 140 that extends in the first horizontal direction. The alignment key 140 may have a thickness substantially the same as that of the first horizontal beam 114, but is not limited thereto. According to an exemplary embodiment of the inventive concept, the thickness of the alignment key 140 may be greater or less than the thickness of the first horizontal beam 114. Further, the alignment key 140 may have various geometric shapes and thicknesses and is not limited to the above described examples.

In exemplary embodiments of the inventive concept, the probe 100 may be formed by the following processes. Three metal layers may be sequentially formed on a substrate. The metal layers may be patterned to form the first probe body 110, the second probe body 120 and the tip 130. The first probe body 110, the second probe body 120 and the tip 130 may be detached from the substrate. An alignment key 140 may be formed at any one position on the probes 100.

Figure 4:
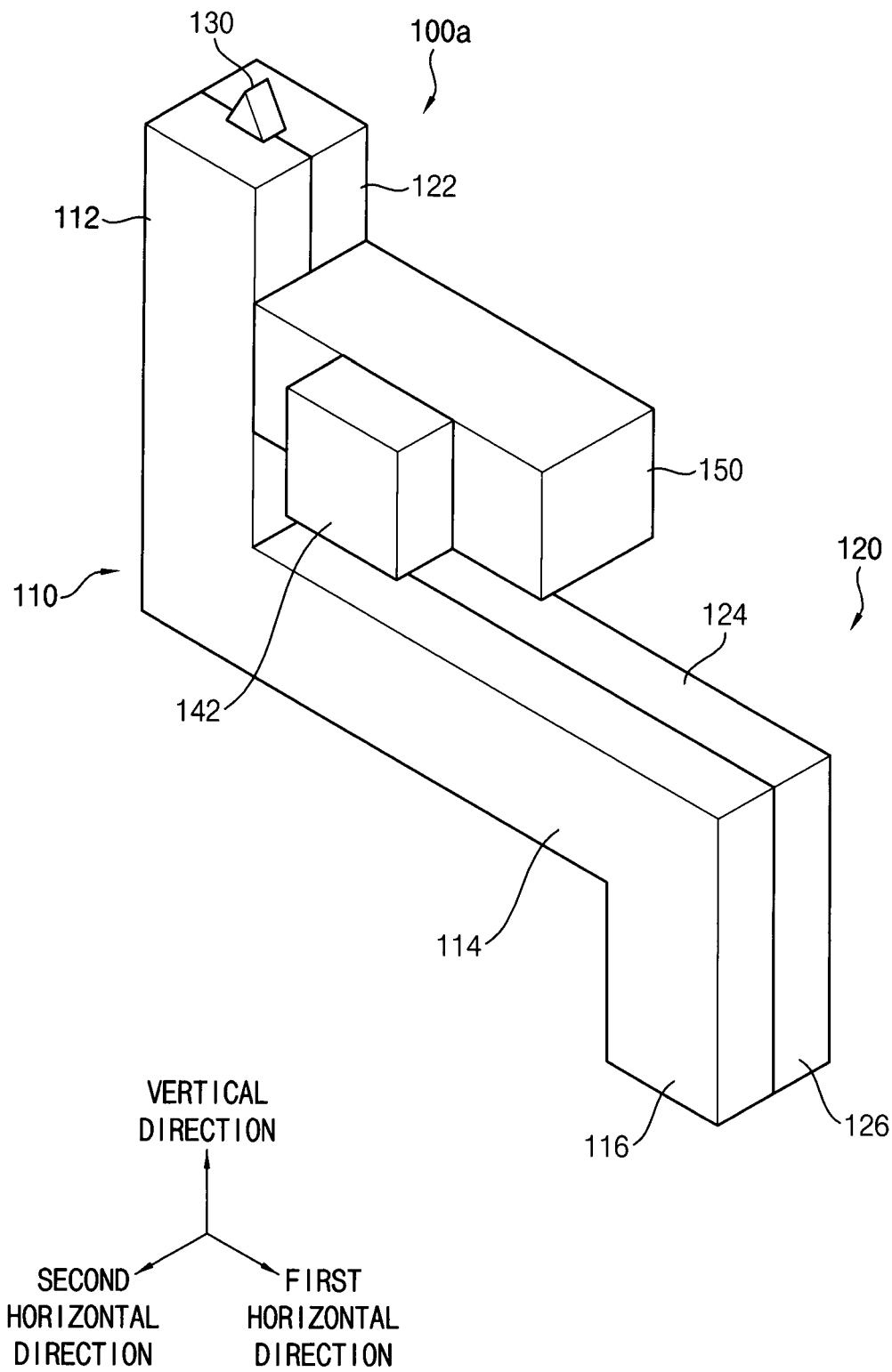
FIG. 4 is a perspective view illustrating a probe in accordance with an exemplary embodiment of the inventive concept.
Figure 5:
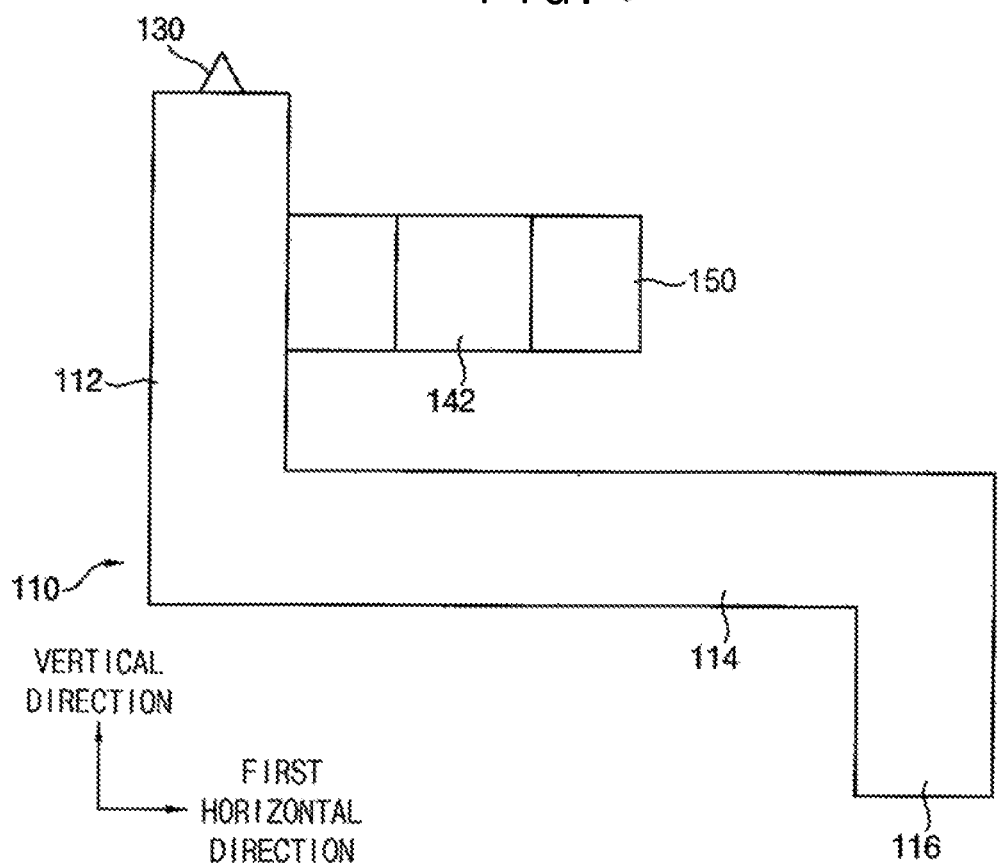
FIG. 5 is a side view illustrating the probe in FIG. 4.
Figure 6:
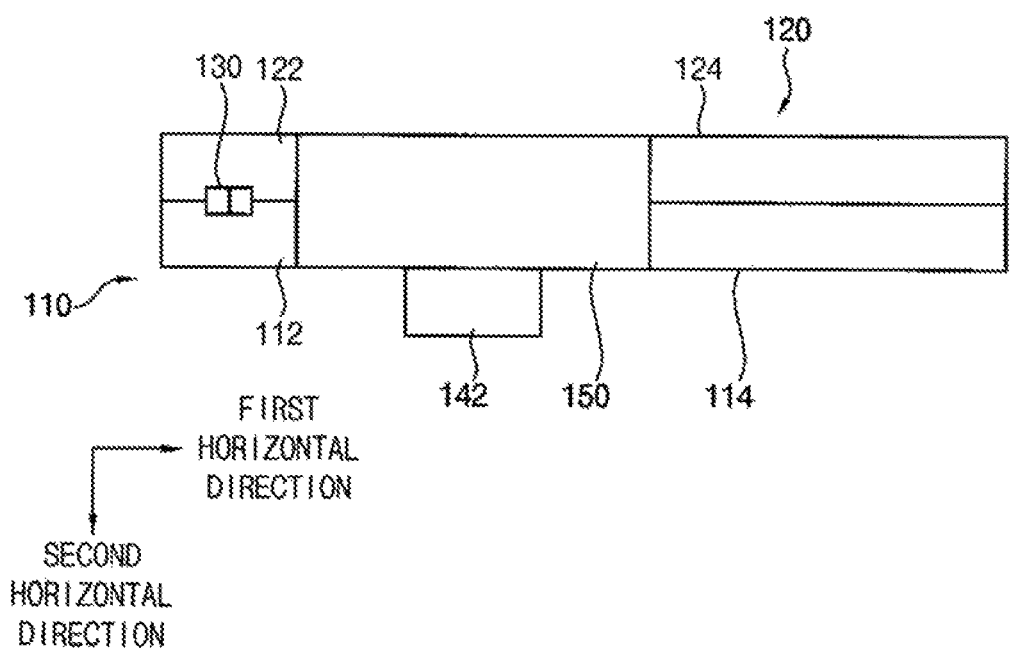
FIG. 6 is a plan view illustrating the probe in FIG. 4.

FIG. 4 is a perspective view illustrating a probe in accordance with an exemplary embodiment of the inventive concept, FIG. 5 is a side view illustrating the probe in FIG. 4, and FIG. 6 is a plan view illustrating the probe in FIG. 4.

A probe 100a of the present embodiment may include elements substantially the same as those of the probe 100 in FIG. 1 except for a position of the alignment key. Thus, the same reference numerals may refer to the same elements and any further illustrations with respect to the same elements may be omitted herein for brevity.

Referring to FIGS. 4 to 6, the probe 100a may further include an alignment beam 150. The alignment beam 150 may extend from the inner surfaces of the first and second upper vertical beams 112 and 122 in the first horizontal direction. For example, parallel surfaces of the first and second upper vertical beams 112 and 122 may face the first and second horizontal beams 114 and 124. The alignment beam 150 may overlap at least a portion of the first horizontal beam 114 and/or the second horizontal beam 124 and may be elevated with respect to an upper surface of the first and second horizontal beams 114 and 124. The alignment beam 150 may have a length shorter than that of the horizontal beams 114 and 124 in the horizontal direction.

An alignment key 142 may protrude from an outer side surface of the alignment beam 150 in the second horizontal direction. The alignment key 142 of this example embodiment may have a shape substantially the same as that of the alignment key 140 in FIG. 1, but is not limited thereto. The alignment key 142 may include various shapes and sizes.

FIG. 7 is a perspective view illustrating a probe in accordance with an exemplary embodiment of the present inventive concept.

A probe 100b of the present embodiment may include elements substantially the same as those of the probe 100 in FIG. 1 except for shapes of first and second probe bodies. Thus, the same reference numerals may refer to the same elements and any further illustrations with respect to the same elements may be omitted herein for brevity.

Referring to FIG. 7, a first probe body 160 may include a first vertical beam 162, a first upper horizontal beam 164 and a first lower horizontal beam 166. The first vertical beam 162 may extend in the vertical direction. The first upper horizontal beam 164 may extend from a middle portion of the first vertical beam 162 in the first horizontal direction. The first lower horizontal beam 166 may extend from a lower portion of the first vertical beam 162 in the first horizontal direction. In other words, the first lower horizontal beam 166 may be positioned under the first upper horizontal beam 164. For example, the first upper horizontal beam 164 may be disposed to at least partially overlap the first lower horizontal beam 166. The first vertical beam 162, the first upper horizontal beam 164 and the first lower horizontal beam 166 may have a rectangular parallelepiped shape having substantially the same width throughout. A second probe body 170 may have a shape substantially the same as that of the first probe body 160. Thus, the second probe body 170 may include a second vertical beam 172, a second upper horizontal beam 174 and a second lower horizontal beam 176. The second vertical beam 172 may extend in the vertical direction. The second upper horizontal beam 174 may extend from a middle portion of the second vertical beam 172 in the first horizontal direction. The second lower horizontal beam 176 may extend from a lower portion of the second vertical beam 172 in the first horizontal direction. In other words, the second lower horizontal beam 176 may be positioned under the second upper horizontal beam 174. The second vertical beam 172, the second upper horizontal beam 174 and the second lower horizontal beam 176 may have a rectangular parallelepiped shape having substantially the same width throughout.

An alignment key 144 may protrude from an outer side surface of the first probe body 160 in the second horizontal direction. Particularly, the alignment key 144 may protrude from a side surface of the first upper horizontal beam 164 in the first probe body 160 in the second horizontal direction. The alignment key 144 may have a shape substantially the same as the shape of the alignment key 140 described above.

Figure 8:
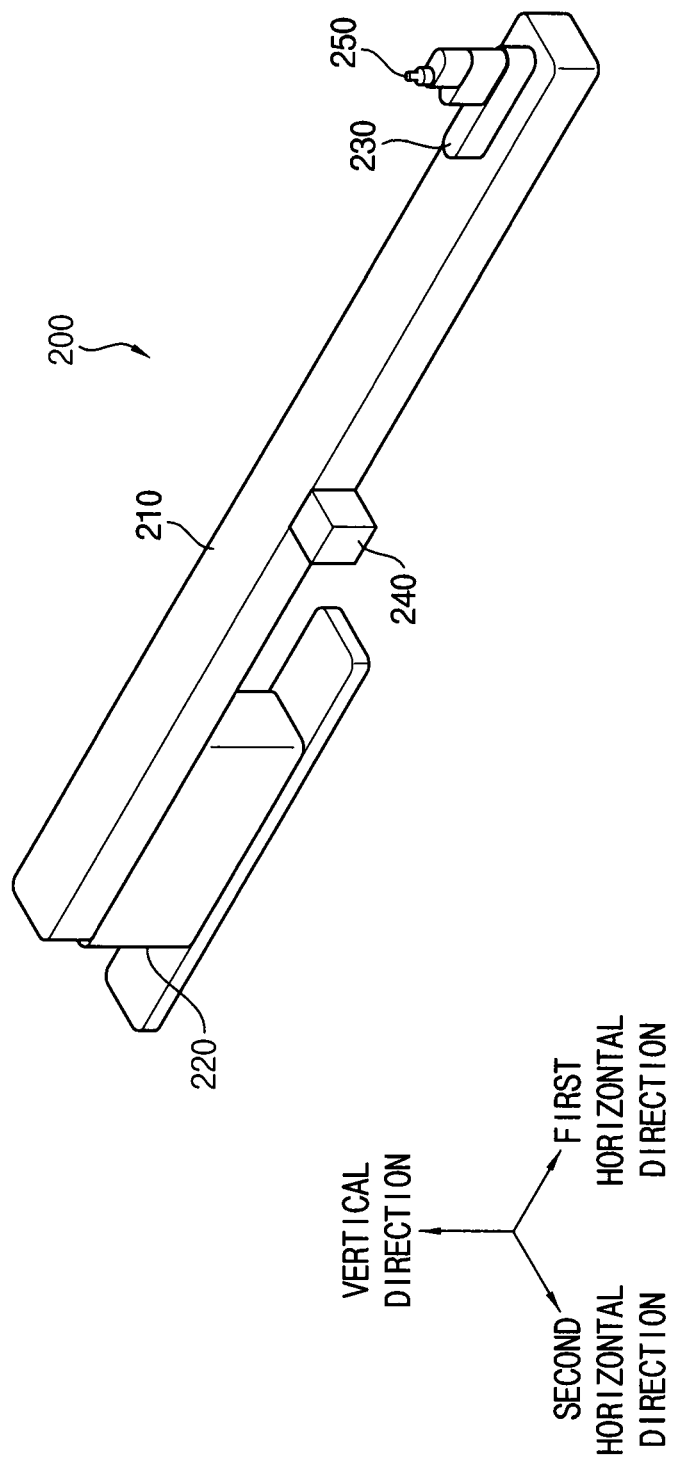
FIG. 8 is a perspective view illustrating a probe in accordance with an exemplary embodiment of the inventive concept.
Figure 9:
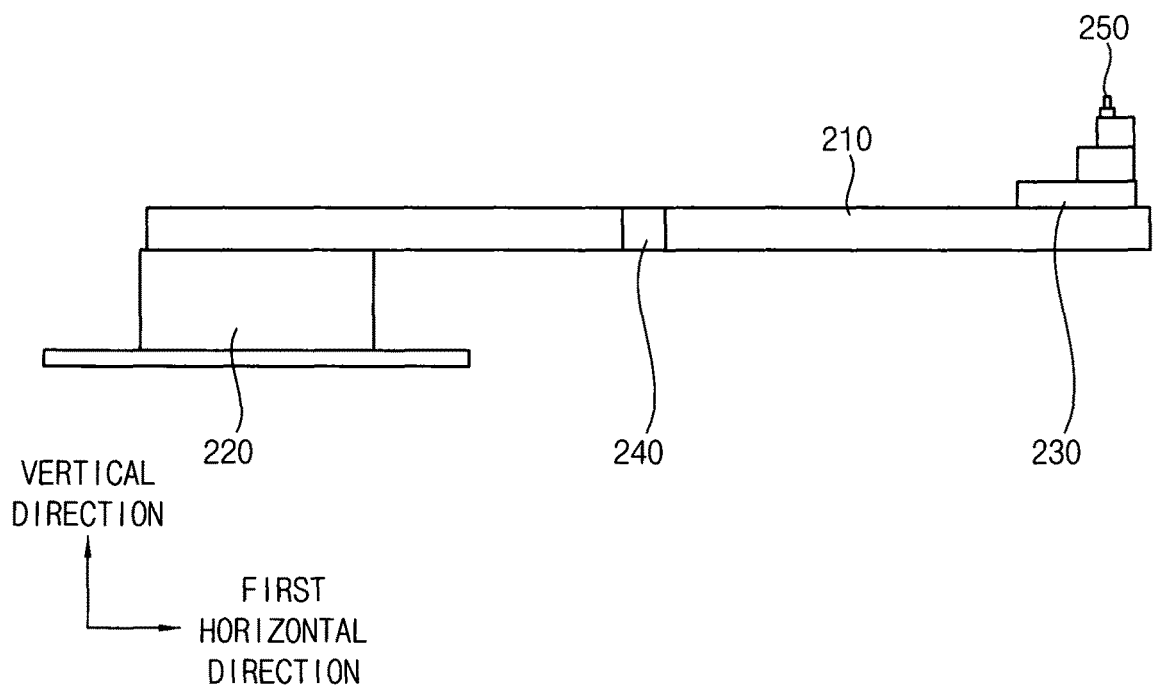
FIG. 9 is a side view illustrating the probe in FIG. 8.
Figure 10:
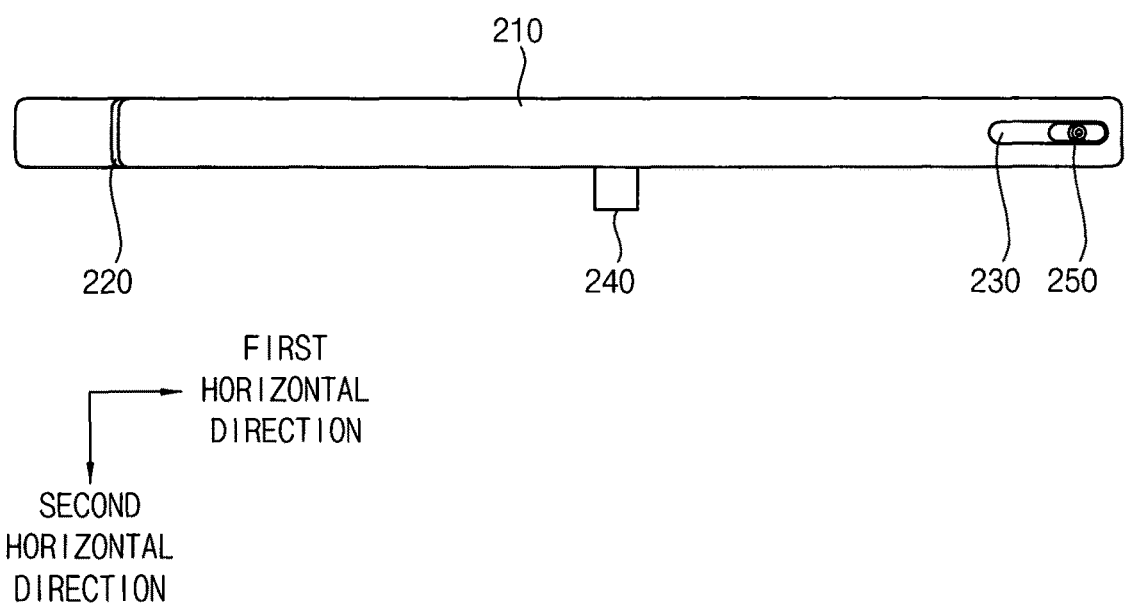
FIG. 10 is a plan view illustrating the probe in FIG. 8.

FIG. 8 is a perspective view illustrating a probe in accordance with an exemplary embodiment of the inventive concept, FIG. 9 is a side view illustrating the probe in FIG. 8, and FIG. 10 is a plan view illustrating the probe in FIG. 8.

Referring to FIGS. 8 to 10, a probe 200 of the present embodiment may have a three dimensional structure. The probe 200 may include a beam 210, a post 220, a base 230, an alignment key 240 and a tip 250.

The beam 210 may have a long rectangular parallelepiped shape that extends in the first horizontal direction. The post 220 may extend from a left side surface of the beam 210 in the vertical direction. The post 220 may be electrically connected with the PCB. Thus, a test signal may be transmitted to the beam 210 through the post 220. The post 220 may be integrally formed with the beam 210.

The base 230 may be formed, for example, on a right upper surface of the beam 210. The base 230 may be integrally formed with the beam 210. The tip 250 may be formed on the base 230. The tip 250 may make contact with the pad of the semiconductor chip. The tip 250 may be integrally formed with the base 230.

The alignment key 240 may protrude from a side surface of the beam 210 in the second horizontal direction. The first and second horizontal directions may be substantially perpendicular to one another. The alignment key 240 may protrude, for example, from a middle portion of a left side surface of the beam 210 in the second horizontal direction. The alignment key 240 may have a shape substantially the same as that of the alignment key 140 described above.

The three dimensional probe 200 may be formed by processes for forming the beam 210, the post 220, the base 230 and the tip 250 in a multi-layered substrate. The alignment key 240 may be formed on any one of the three dimensional probes 200.

According to an exemplary embodiment of the inventive concept, the alignment key 240 may be provided on a probe 200 that contacts a pad of the semiconductor chip. Thus, vertical stresses may be applied to the alignment key 240 as well as the pad of the semiconductor chip so that the alignment key 240 may reflect height changes of the probe 200.

Figure 11:
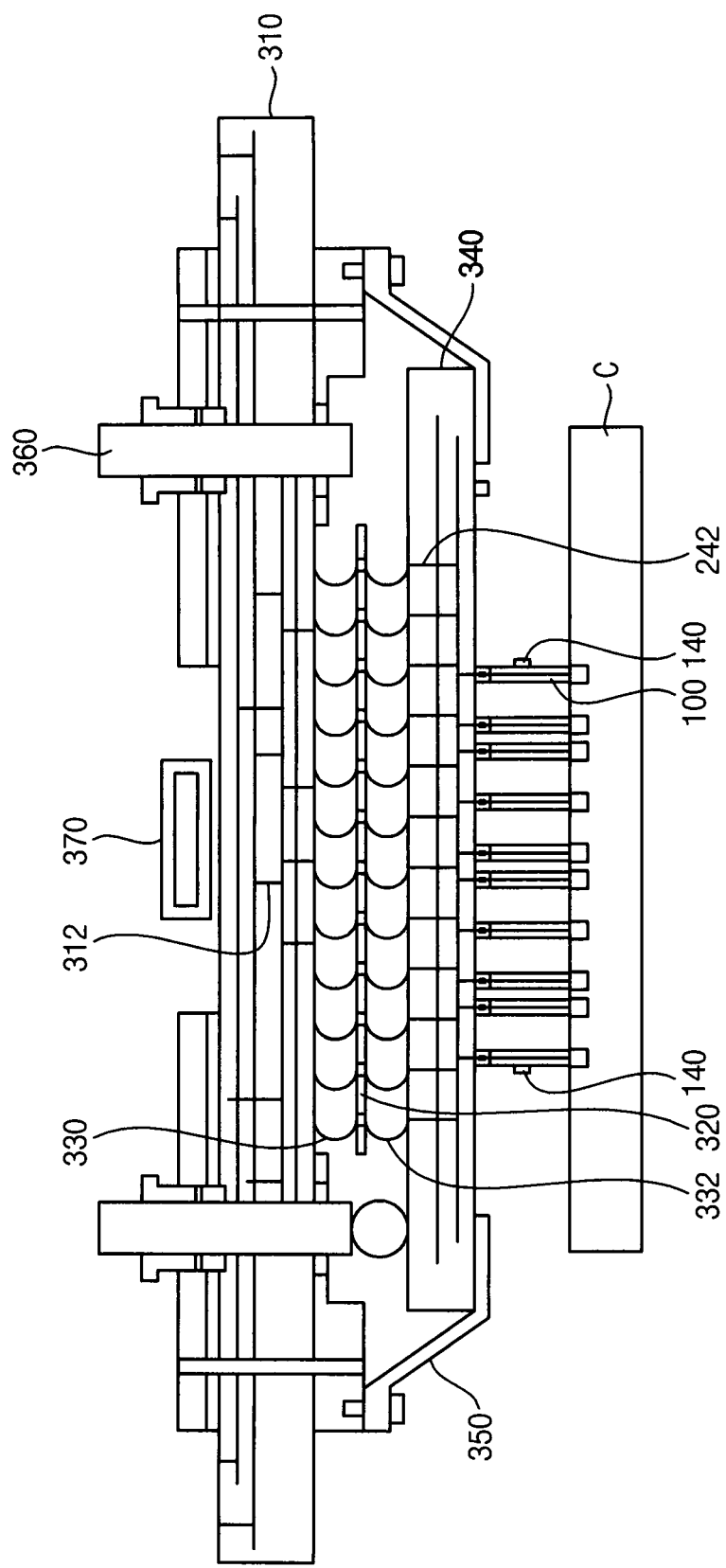
FIG. 11 is a cross-sectional view illustrating a probe card including the probe in FIG. 1.
Figure 12:
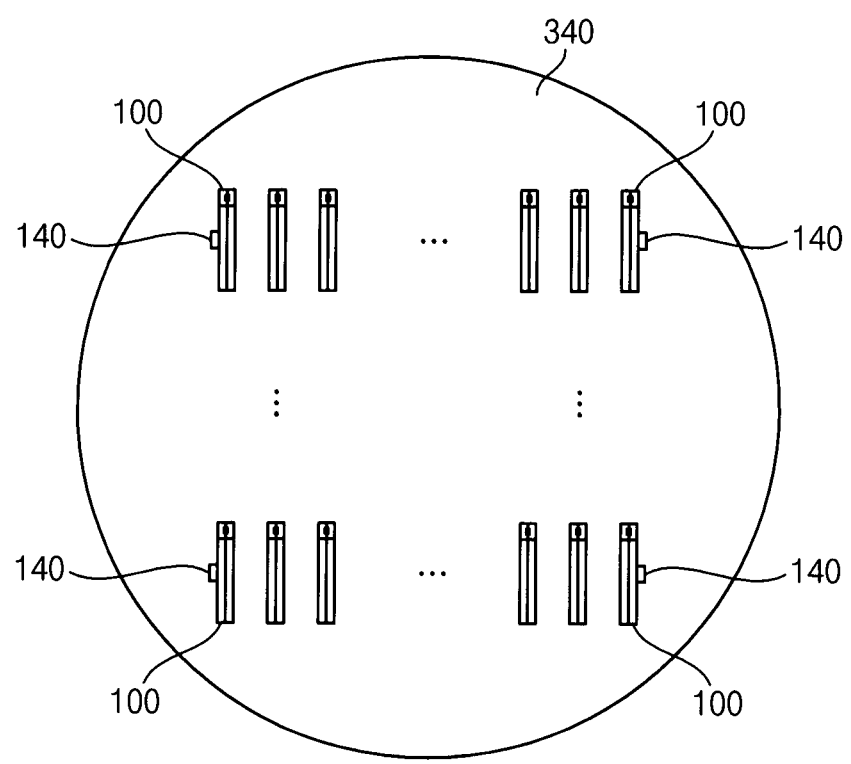
FIG. 12 is a plan view illustrating probes on a printed circuit board (PCB) of the probe card in FIG. 11.

FIG. 11 is a cross-sectional view illustrating a probe card including the probe of FIG. 1, and FIG. 12 is a plan view illustrating probes on a PCB of the probe card in FIG. 11.

Referring to FIGS. 11 and 12, a probe card according to the present embodiment may include a PCB 310, an interposer 320, a first pogo pin 330, a second pogo pin 332, a probing plate 340, a supporting plate 350, a pair of gap-adjusting screws 360, a stiffener 370 and a plurality of probes 100.

The PCB 310 may include a multi-layered substrate. The PCB 310 may include a test pattern 312. The test pattern 312 may be arranged in the PCB 310. The test pattern 312 may electrically connect a tester for generating the test signals.

The interposer 320 may be disposed under the PCB 310. The first pogo pin 330 may be disposed between the interposer 320 and the PCB 310 to electrically connect the test pattern 312 with the interposer 320. The second pogo pin 332 may be disposed under the interposer 320. For example, the second pogo pin 332 may be disposed between the interposer 320 and the probing plate 340. The second pogo pin 332 may electrically connect with the interposer 320.

The probing plate 340 may be disposed under the interposer 320. The probing plate 340 may include a probing pattern 242. The probing plate 340 may include an insulating material having a thermal expansion coefficient for compensating for a difference between thermal expansion coefficients of the PCB 310 and a semiconductor chip C. In an exemplary embodiment of the present inventive concept, the probing plate 340 may include a ceramic material. The second pogo pin 332 may be disposed between the probing plate 340 and the interposer 320 to electrically connect the probing pattern 342 with the interposer 320.

The supporting plate 350 may support the probing plate 340. An upper end of the supporting plate 350 may be fixed to the PCB 310, for example, by screws. A lower end of the supporting plate 350 may support a lower surface of the probing plate 340. For example, the supporting plate 350 may have a portion that at least partially overlaps a surface of the probing plate 340 facing the semiconductor chip C.

The gap-adjusting screws 360 may adjust a gap between the PCB 310 and the probing plate 340. The gap-adjusting screws 360 may be threadedly combined with the PCB 310 in the vertical direction. Lower ends of the gap-adjusting screws 360 may be connected to the probing plate 340. Thus, the gap between the PCB 310 and the probing plate 340 may be adjusted in accordance with rotation directions of the gap-adjusting screws 360.

The stiffener 370 may be arranged on a central portion of an upper surface of the PCB 310. The stiffener 370 may provide the probe card with stiffness.

The probes 100 may be arranged on a lower surface of the probing plate 340. The probes 100 may electrically connect with the probing pattern 342 of the probing plate 340. Particularly, the first and second lower vertical beams 116 and 126 of each of the probes 100 may electrically connect to the probing pattern 242 of the probing plate 340. Alternatively, when the probe card may not include the probing plate 340, the probes 100 may be arranged on a lower surface of the PCB 310.

The probes 100 may be arranged on the lower surface of the probing plate 340 in lengthwise and breadthwise directions spaced apart by a uniform gap. Particularly, the probes 100 on the lower surface of the probing plate 340 may collectively form a rectangular shape.

The alignment key 140 may be disposed at four probes 100 among the total probes 100 at corners of the rectangular shape. Further, the alignment key 100 may protrude from the outer side surface of the first probe body 110 of each of the four probes 100 toward an outskirt portion of the probing plate 340. As mentioned above, when the probe card may not include the probing plate 340, the alignment key 100 may protrude from the outer side surface of the first probe body 110 of each of the four probes 100 toward an outskirt portion of the PCB 310.

The similar pattern may not exist on a straight line from the camera to the alignment key 140 protruded in the second horizontal direction through the outer side surfaces of the probes 100. Thus, the camera may not mistake the similar pattern for the alignment key 140.

Vertical stresses applied to the probes 100 during operation may cause a change in probe height. The alignment key 140 may be formed on at least one probe 100 contacting a pad of the semiconductor chip. Thus, the vertical stresses may be applied to the alignment key 140 as well as the pads of the semiconductor chip. Therefore, the alignment key 140 may reflect the height changes of the probes 100.

Alternatively, the probe card may include the probe 100a in FIG. 4, the probe 100b in FIG. 7 or the probe 200 in FIG. 8.

According to an exemplary embodiment of the inventive concept, the alignment key may protrude from the side surface of the probe body so that a camera may accurately recognize the alignment key. Thus, the camera may not mistake a similar pattern for the alignment key. The alignment key may be provided to only one among the probes making contact with the semiconductor chip, and the alignment key may accurately reflect height changes of the probe. Therefore, the probe card may be accurately aligned with the semiconductor chip so that test reliability of the semiconductor chip may be improved.

While exemplary embodiments of the present inventive concept have been particularly shown and described, it will be understood by one of ordinary skill in the art that variations in form and detail may be made therein without departing from the spirit and scope of the present inventive concept as defined by the accompanying claims.

What is claimed is:

1. A probe comprising:
 a probe body for providing an object with a test signal;
 a tip arranged on an end of the probe body to make contact with the object; and
 an alignment key protruded from a side of the probe body, wherein the probe body comprises:
 a vertical beam extended in a vertical direction; and
 a horizontal beam extended from the vertical beam in a first horizontal direction; and
 an alignment beam extended from the vertical beam in the first horizontal direction, wherein the alignment key protrudes from the alignment beam such that it does not overlap the horizontal beam in the vertical direction.

2. The probe of claim 1, wherein the alignment key extends in a second horizontal direction substantially perpendicular to the first horizontal direction.

3. The probe of claim 1, wherein the tip extends from said vertical beam.

4. The probe of claim 1, wherein the alignment key has an angular shape.

5. The probe of claim 1, wherein the alignment key has a rectangular parallelepiped shape.

6. The probe of claim 1, wherein the alignment key is integrally formed with the probe body.

7. The probe of claim 1, wherein the alignment beam is positioned over the horizontal beam.

8. The probe of claim 1, wherein the alignment beam is shorter than the horizontal beam.

9. A probe card comprising:
 a printed circuit board (PCB) including a test pattern through which a test signal for testing a semiconductor chip flows;
 a plurality of probes, at least one of the probes including a probe body electrically connected with the test pattern, a tip arranged on an end of the probe body to make contact with a pad of the semiconductor chip, and an alignment key protruded from a side of the probe body, wherein the probe body comprises:
 a vertical beam extended in a vertical direction; and
 a horizontal beam extended from the vertical beam in a first direction; and
 an alignment beam extended from the vertical beam in the first direction, wherein the alignment key protrudes from the alignment beam such that it does not overlap the horizontal beam in the vertical direction.

10. The probe card of claim 9, wherein the probes are arranged in the first direction and a second direction on the PCB, and the at least one probe is disposed at an end of a row of the probes.

11. The probe card of claim 10, wherein the alignment key of the at least one probe protrudes toward an outer portion of the PCB.

12. The probe card of claim 11, wherein the alignment key extends in the second direction substantially perpendicular to the first direction.

13. The probe card of claim 9, further comprising:
 an interposer interposed between the PCB and the probes;
 a first pogo pin for electrically connecting the interposer with the test pattern of the PCB; and
 a second pogo pin for electrically connecting the interposer with the probes.

14. The probe card of claim 13, further comprising a probing plate disposed under the second pogo pin, the probing plate includes a probing pattern for electrically connecting the second pogo pin with the probes.

15. The probe card of claim 14, further comprising a supporting plate disposed on the PCB to support the probing plate.

16. The probe card of claim 14, further comprising a gap-adjusting screw connected with the probing plate through the PCB to adjust a gap between the PCB and the probing plate.

* * * * *